United States Patent [19]

Buchmann et al.

[11] Patent Number: 4,803,181
[45] Date of Patent: Feb. 7, 1989

[54] PROCESS FOR FORMING SUB-MICROMETER PATTERNS USING SILYLATION OF RESIST SIDE WALLS

[75] Inventors: Peter L. Buchmann; Peter Vettiger, both of Langnau; Bart J. Van Zeghbroech, Richterswil, all of Switzerland

[73] Assignee: International Business Machines Corporation, Armonk, N.Y.

[21] Appl. No.: 26,799

[22] Filed: Mar. 17, 1987

[30] Foreign Application Priority Data

Mar. 27, 1986 [EP] European Pat. Off. ........ 86104217.4

[51] Int. Cl.[4] .......................................... H01L 21/265
[52] U.S. Cl. ............................ 437/228; 148/DIG. 51; 148/DIG. 111; 148/DIG. 137; 156/628; 156/659.1; 427/43.1; 437/229; 437/935; 437/962
[58] Field of Search ............... 156/628, 643, 644, 646, 156/652, 651, 659.1, 668; 427/43.1, 40, 41; 430/296, 313, 325; 437/50, 187, 200, 228, 229, 244, 44, 962, 935

[56] References Cited

U.S. PATENT DOCUMENTS

| | | | |
|---|---|---|---|
| 4,377,437 | 3/1983 | Taylor et al. | 156/659.1 |
| 4,377,734 | 3/1983 | Mashiko et al. | 156/643 |
| 4,389,482 | 6/1983 | Bargon et al. | 430/325 |
| 4,419,809 | 12/1983 | Riseman et al. | 437/44 |
| 4,445,267 | 5/1984 | De La Moneda et al. | 437/44 |
| 4,502,914 | 3/1985 | Trumpp et al. | 156/643 |
| 4,504,574 | 3/1985 | Meyer et al. | 430/313 |
| 4,552,833 | 10/1985 | Ito et al. | 430/313 |
| 4,601,778 | 7/1986 | Robb | 156/628 |
| 4,613,398 | 9/1986 | Chiong et al. | 156/628 |
| 4,657,845 | 4/1987 | Frechet et al. | 156/628 |

OTHER PUBLICATIONS

Riseman, "Precision-Submicron-Dimensional Mask for X-ray Lithography," IBM TDB, vol. 27 No. 7B, Dec. 1984, pp.4115-4117.
Johnson Jr. et al., "Method for Making Submicron . . . Sidewall Image Transfer Techniques," IBM TDB, vol. 26, No. 9, Feb. 1984, pp. 4587-4589.

Primary Examiner—Brian E. Hearn
Assistant Examiner—William D. Bunch
Attorney, Agent, or Firm—Anne Vachon Dougherty

[57] ABSTRACT

A process for forming sidewalls for use in the fabrication of semiconductor structures, where the thin, vertical sidewalls are "image transferred" to define submicron lateral dimensions.

First, a patterned resist profile with substantially vertical edges is formed on a substrate on which the sidewalls are to be created. Then, the profile is soaked in a reactive organometallic silylation agent to silylate the top and the vertical edges of the resist to a predetermined depth, thereby rendering the profile surfaces highly oxygen etch resistant. In a subsequent anisotropic RIE process, the horizontal surfaces of the silylated profile and the unsilylated resist are removed, leaving the silylated vertical edges, that provide the desired free-standing sidewalls, essentially unaffected.

15 Claims, 2 Drawing Sheets

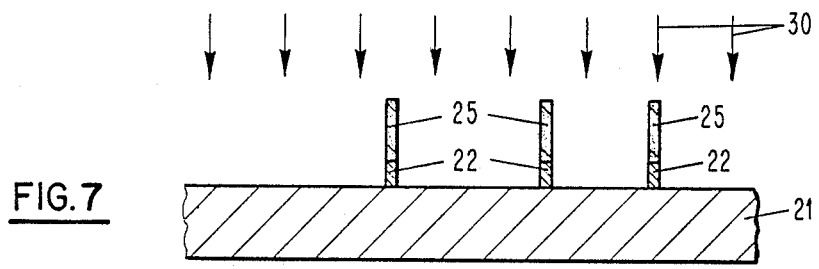
FIG. 7
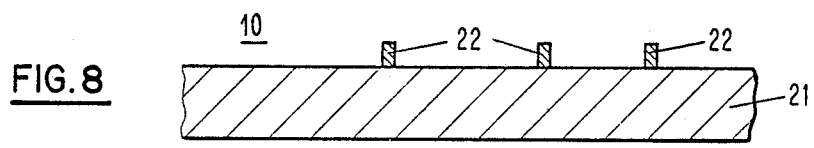
FIG. 8
FIG. 9
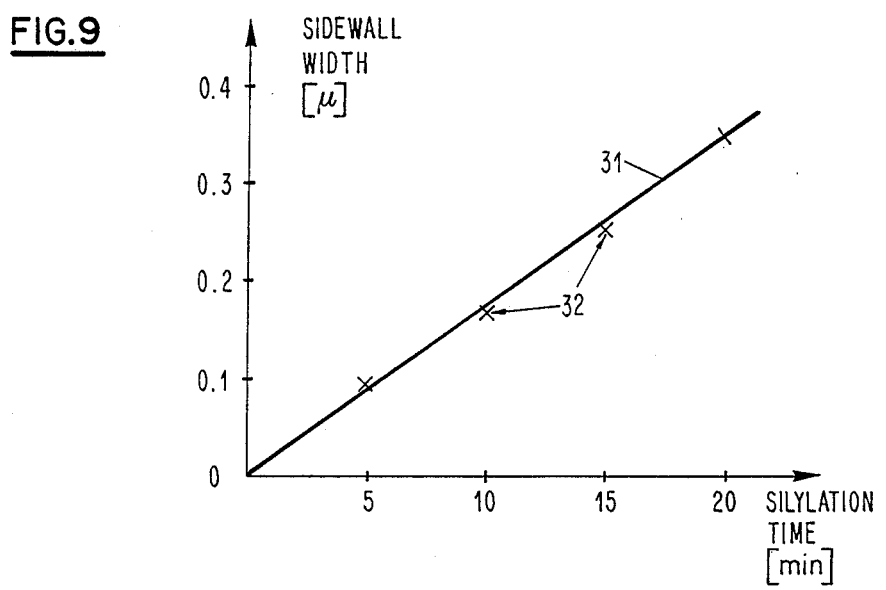

PROCESS FOR FORMING SUB-MICROMETER PATTERNS USING SILYLATION OF RESIST SIDE WALLS

The invention relates to a process for forming sidewalls for use in the fabrication of structures with sub-micron lateral dimensions; and, to the implementation of this process to produce very narrow line width structures. The invention is particularly useful in the fabrication of semiconductor devices, including those used in opto-electronic technologies.

BACKGROUND OF THE INVENTION

There has been a dramatic increase in the use of integrated circuits (IC's) over the last decade which resulted in an increased demand for greater complexity, higher operating speeds, and smaller device dimensions in the IC's. A number of methods are known to increase the integration density of integrated circuits. Considerable improvements have been achieved mainly by decreasing photolithographic defect densities. By using electron and X-ray exposure methods instead of the hitherto used light radiation, progress was made in the direction of higher resolution. There were, furthermore, efforts to reach very narrow line widths in the sub-micron range by extending conventional lithographic processes, rather than utilizing the cost-intensive techniques of electron and X-ray lithography. With the technique of plasma, or reactive ion, etching for etching metals and semi-conductive and dielectric materials, further developments took place in the direction of very narrow line widths and, therefore, improved device performance.

A number of publications and patents describe the so-called sidewall technology by means of which structures in the sub-micron range can be made. In U.S. Pat. No. 4,256,514, a method for forming a narrow dimensioned region on a silicon body is described that involves forming, on the silicon body, regions having horizontal surfaces and substantially vertical surfaces. A thin conformal layer is formed, both on the horizontal and substantially vertical surfaces. Reactive ion etching is applied to the layer to remove the horizontal layer while leaving the vertical layer substantially intact. These vertical sidewalls define very narrow dimensioned regions on the silicon body.

A further development is disclosed in U.S. Pat. No. 4,502,914. Here structures of a polymeric layer with horizontal and substantially vertical surfaces are first made on a substrate. Thereupon, a conformal silicon nitride or oxide layer is plasma deposited and subjected to reactive ion etching methods such that its horizontal regions and the polymeric structures are removed, with merely the narrow regions of the silicon nitride or oxide layer, that has originally been arranged adjacent to the vertical surfaces of the polymeric structures, remaining. The vertical sidewall structures are then converted into a mask with the same dimensions but consisting of a different mask material.

The basic concept of using a sidewall stud of sub-micron width as a mask for processing underlying layers, i.e., the "image transfer" concept, has also been applied in a process described in the IBM Technical Disclosure Bulletin article "Method for Making Sub-Micron Dimensions in Structures Using Sidewall Image Transfer Techniques" (Vol. 26, No. 9, February 1984, pp. 4587–4589). This process involves the deposition of a conformal $Si_3N_4$ layer over a resist pattern and subsequent reactive ion etching which leaves a $Si_3N_4$ sidewall at the vertical resist edges. Removal of the resist results in the self-standing studs which can be used as a mask to, for example, define an FET gate of sub-micron gate length.

Another sidewall technique that can be employed to produce sub-micron features is described in IBM Technical Disclosure Bulletin article "Precision-Sub-Micron-Dimensioned Mask for X-Ray Lithography" (Vol. 24, No. 7B, December 1984, pp. 4115–4117). Here, the oxide that grows on the vertical walls of patterned polysilicon films is used as a mask.

In contrast to these known processes, where the sidewalls are formed on the vertical surfaces of a profile, the sidewalls formed with the process disclosed by the present invention, and which eventually determine the sub-micron dimensions, are produced within the vertical surfaces of a polymeric resist profile. The sidewalls are produced in a silylation process which makes the exposed polymeric material of the profile substantially more etch resistant. The sidewall thickness is determined by the parameters of the silylation process. The rather complex hitherto known technique of forming thermally stable patterns and subsequently depositing a conformal layer, from which the sidewalls are obtained, is eliminated.

Silylation is defined as the replacement of an active hydrogen of a protic material (—OH, —NH, —SH) with a substituted silicon atom. The silylation of organic compounds is a technique that has been known but has only recently been used to alter the development rate of resists and to improve the resistance to reactive ion etching (RIE) in $O_2$ plasma.

Silylation processes as well as the polymeric materials and silylation agents that can be used have been described in a number of references. Representative art citations, with regard to the application of silylation techniques in IC fabrication, are given below. Each of the cited reference are assigned to the present assignee and the teachings located therein are hereby incorporated by reference.

U.S. patent application Ser. No. 679,527 describes a method for producing multi-layer, plasma-developable resists which are capable of providing sub-micron resolution. In the teachings, the upper portion of a layer of polymeric material that has been exposed to patterned radiation is converted into a dry etch resistant form using a silylation process. Specific polymeric materials that can be employed, are defined therein.

U.S. Pat. No. 4,552,833 relates to a process for producing a negative-tone resist image. The image is produced by the successive steps of: first, exposing a film to a pattern of radiation, the film having such a composition that, upon exposure to radiation, the film comprises a polymer which can react with an organometallic reagent; then, treating the exposed film with an organometallic reagents and, finally developing a relief image by further treating the exposed film with an oxygen plasma. Preferred polymers and organometallic reagents are given.

In U.S. patent application Ser. No. 713,370 a method for creating multilayer patterned films is disclosed wherein at least one layer is etch resistant. This layer is obtained by silylating a patterned polymeric film in an organometallic reagent. The pattern is subsequently transferred using an oxygen plasma or equivalent dry-etch method.

U.S. patent application Ser. No. 713,509 describes a process for obtaining plasma resistant polymeric materials as well as their uses in lithography. The materials are prepared by reacting a polymeric material with an organometallic silylation agent such as HMCTS, hexamethylcyclotrisilazane.

The above cited references are representative of the present use of silylation techniques in the fabrication of integrated circuits. These known processes are used to form etch-resistant silylated resist layers but do not suggest any application in the formation of sidewalls as proposed in the present invention.

SUMMARY OF THE INVENTION

It is the main objective of the present invention to extend the use of conventional lithographic techniques to dimensions in the sub-micron range by utilizing silylation techniques to produce etch resistant profile surfaces and by subsequently utilizing an anisotropic etch process to produce sub-micron sidewalls.

The invention as claimed is intended to meet the above objective. This is achieved by using a process wherein a layer of polymeric resist comprising active hydrogen (such as —OH, —NH, —SH) is deposited on a substrate. The resist is patterned in accordance with known techniques to a profile with substantially vertical edges where the sidewalls are to be formed.

The resist is then treated with a reactive organometallic silylation agent to replace the active hydrogen atoms with silicon atoms, i.e., to silylate the top and the substantially vertical edges of the profile to a predetermined depth thereby rendering the profile surfaces highly oxygen dry-etch resistant.

The final step is one of anisotropic oxygen dry etching to remove the silylated resist at the top of the profile. Thereafter, the unsilylated resist is removed, leaving the silylated, substantially vertical edges of the profile essentially unaffected.

The advantages offered by the inventive process are mainly that it requires fewer and less critical process steps. Moreover, standard resists can be used to form the patterned profile since only low temperature (below 100° C.) process steps are subsequently employed. The complex high temperature, time-consuming CVD deposition process, hitherto required for the deposition of a conformal layer, is replaced by the very simple, silylation process which can take place at room temperature.

While providing the same and better resolution and reproducibility as obtainable with the well known processes, the new process permits substantial reduction in process complexity, tooling needs and processing time thus resulting in substantial cost saving.

BRIEF DESCRIPTION OF THE DRAWINGS

A detailed description of the invention follows making reference to the drawings which illustrate one specific embodiment wherein:

FIGS. 2-8 are illustrations of the steps of the process used to fabricate the structure shown in FIG. 1.

FIG. 9 is a diagram illustrating the linear relationship between the silylation time and the resulting sidewall width for the silylation process utilized herein.

DETAILED DESCRIPTION OF THE INVENTION

Figure 1:
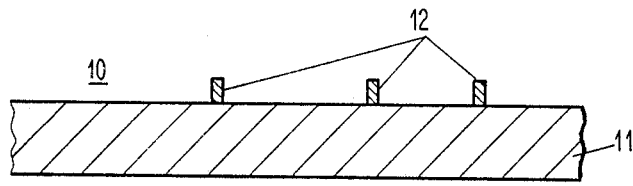
FIG. 1 is a cross-sectional representation of a sub-micron line width structure produced in accordance with the invention.

Referring now to FIG. 1, there is shown a sub-micron structure 10 which consists of a pattern of sub-micron width metallization lines 12 on semiconductor body 11. The lines are produced employing the process of the present invention which provides for the formation of sidewalls using silylation techniques. The sidewalls then serve as a mask to define the location and the sub-micron lateral dimensions for the metal lines.

In the embodiment herein described, the lines consist of a metal and may, for example, form refractory gates of MESFET's. The invention can, however, also be utilized to produce non-metallic structures.

In FIGS. 2-8 the steps of the process used to fabricate the structure 10 of FIG. 1 are illustrated in detail. The successive steps are listed in Table I indicating the correspondence between the steps and the drawings.

TABLE 1

| Step No. | Description of Process Step | FIG. |
|---|---|---|
|  | Starting point: a substrate consisting of a semiconductor body covered with a blanket layer to be patterned. | 2 |
| 1 | Spinning an active hydrogen-containing resist layer; followed by pre-baking and pattern exposure. | 3 |
| 2 | Developing the resist to form vertical edge profiles; followed by rinsing, drying, and baking. | 4 |
| 3 | Soaking in a silylation solution to increase the etch resistance of the resist down to a predetermined depths; followed by cleaning, drying and post-baking. | 5 |
| 4 | Anisotropic etching (RIE) the resist profile leaving only the silylated vertical portions forming the desired sidewalls. | 6 |
| 5 | Anisotropic etching (RIE) the underlying blanket layer portions not protected by the sidewall masks. | 7 |
| 6 | Removal of the sidewalls leaving the desired sub-micron layer pattern. | 8 |

While the following description is primarily directed to the fabrication of the structure shown in FIG. 1, this description is only exemplary of the inventive process. It should be noted that the process of forming sidewall masks using silylation techniques can be employed in a wide variety of applications, some of which will be mentioned further below; and, that the thicknesses, and other dimensions, the materials used, and the process parameters chosen for the specific process described herein, are selected for clarity of illustration and are not intended to be interpreted in a limiting sense. Many of the individual process steps used, for example depositing layers of different materials, exposing, developing and etching, are well known and can be performed employing any number of conventional techniques. They are, therefore, not explained in greater detail herein, as such is presumed to be well known in the art.

Figure 2:
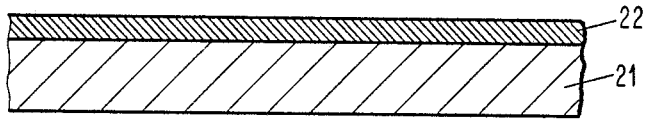

Referring now to FIG. 2, the fabrication process is initiated starting with a semiconductor wafer 21 having a diameter of about 30 mm. A blanket material to be etched, such as metal layer 22 of 0.2 $\mu$ thickness, is deposited on the wafer. In the described embodiment, the semiconductor material was Gallium-arsenide (GaAs) and the metal was tungsten silicide ($WSi_x$). The metallized structure serves as the "substrate" on which the sidewall masks are to be formed. The sidewall masks can subsequently be used to define the desired submicron pattern in metallic layer 22.

Figure 3:
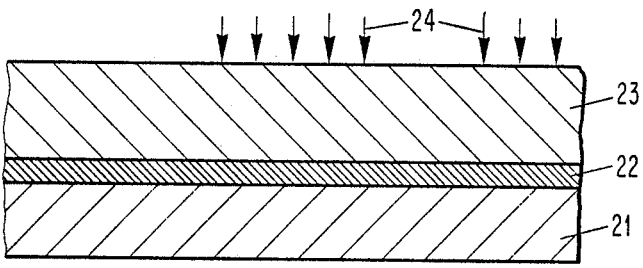
Figure 4:
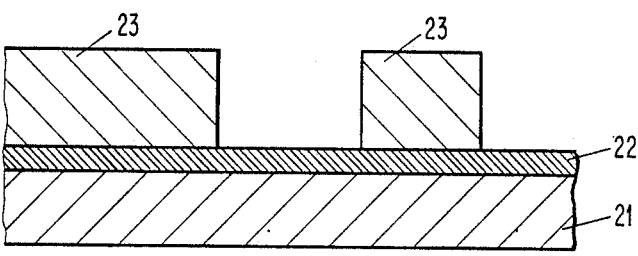

In a first step, illustrated in FIG. 3, a layer of a positive photoresist 23 of about 900 nm thickness is spin-deposited (at 6000 rpm, 30 s), pre-baked for 20 minutes at 90° C., and then exposed to a light pattern (wavelength 300 nm, 10 mW/cm$^2$, 30 s). The resist used, by way of example, was AZ 4110, an American Hoechst Corp. product. Suitable for the process are all resists which can be silylated, including virtually all positive resists and resists having a novolak resin.

Next, in step 2, the photoresist 23 is developed for 30 seconds using AZ 400K developer diluted with H$_2$O (1:4). This results in resist profiles 23 having horizontal top surfaces and substantially vertical edges as illustrate in FIG. 4. The structure produced is then rinsed (H$_2$O, for approximately 2178 min) to remove the remaining developer, dried, and baked for 20 minutes at 90° C.

Figure 5:
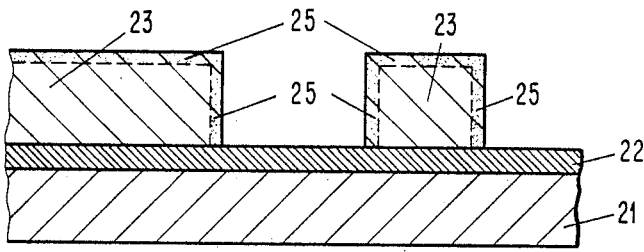

Subsequently, reference is now made to FIG. 5, the structure is soaked in a silylation solution, for example a solution of Xylene:HMCTS:NMP (89.10:1), for 5 minutes at 20° C. This third step results in the silylation of all exposed surfaces 25, of the resist profiles 23 down to a predetermined desired depth, herein 0.1 μm, whereby the silylated resist becomes substantially more resistant to a subsequent oxygen etch process.

Contrary to previously known sidewall techniques, these etch resistant silylated layers are formed within the resist profile rather than applied to the profile surfaces.

The silylation agent used in the described example is a hexamethylcyclotrisilazane (HMCTS), which is stable in aprotic solvents, and safe for use in manufacturing. It reacts with novolak resin contained in the resist, forming a cross-linked insoluble polymer, incorporating silicon in the polymer matrix for RIE resistance. The reaction, in a spun pre-baked resist, is diffusion limited and depends on time, concentration and temperature.

A variety of agents can be used provided they are suitable to replace the hydrogen in the resist with silicon atoms from those agents. Examples are given in the aforementioned U.S. Ser. No. 713,509.

The amount of NMP (n-Methyl pyrrolidone) in the silylation solution substantially determines the speed of the silylation process. One volume %, as in the example, leads to required times in the range of 5 to 20 minutes (at 20° C.), depending on the desired silylation depth. The temperature also plays an important role.

After rinsing the profile in Xylene for 5 seconds at room temperature to remove silicon from the surfaces, it is dried with dry nitrogen, and post-baked for 5 min at 90° C.

Figure 6:
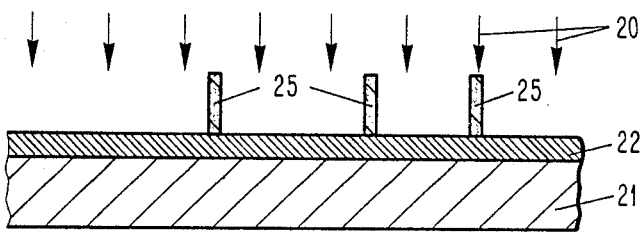

In step 4, the structure is subjected to an anisotropic oxygen (O$_2$) reactive ion etch (RIE) (at 1.3 Pa, with 0.3 W/cm$_2$) as schematically indicated in FIG. 6 by arrows 20. This first removes the silylated resist 25 at the top of the profiles, 23; and subsequently removes the unsilylated resist material down to the underlying metal layer 22. Etching through the silylated layer at the top of the profile is slow, whereas etching through the unsilylated region proceeds much faster.

As taught in the aforementioned silylation art a halogen (for example CF$_4$) can be provided to the etching plasma to etch the silylated portion of the resist. Once the unsilylated resist material is exposed, the halogen ambient may be removed leaving O$_2$ to etch the unsilyated material with, substantially, no effects to the silylated portion.

The etch may be controlled using a laser end point detection (EPD) technique. The time required is about 30 min which includes a 20 % overetch (EPD±2%) for the removal of residuals, e.g., resist material from the top surfaces that contain silicon.

After the RIE step, the structure shown in FIG. 6 remains having the silylated vertical portions 25 of resist profiles 23 forming the desired sidewalls that can be used as a mask to define sub-micron lateral dimensions in the underlying layer or layers the WSi$_x$ layer 22 in the example described herein.

In the next process step 5, the sidewall "image" is transferred to the underlying, WSi$_x$, layer 22 as illustrated in FIG. 7. In an anisotropic etch process, indicated by arrows 30, the exposed portions of layer 22, i.e., those not covered by the sidewalls 25, are removed, A SF$_6$ RIE process, again at 1.3 Pa and 0.3 W/cm$^2$, can be used.

In the final, sixth, process step, the sidewalls 25 are removed (for 10 min in NMP at 80° C.). The resulting structure, shown in FIG. 8, corresponds to that of FIG. 1.

As with known sidewall techniques, the above-described process results in the formation of sidewalls at each substantially vertical slope of the profile. In situations where not all sidewalls are needed for the subsequent image transfer, the undesired sidewalls can be removed in a trimming process (following the anisotropic etch of the resist in step 4). This may be done in an O$_2$/10% CF$_4$ RIE process using a trim mask to define the regions where the sidewalls are to remain. Such trim techniques are well known to the art.

As will be apparent from the above process description, the thickness of the obtained sidewalls is determined by the silylation depth, i.e., the thickness of the resist material that has become highly oxygen etch resistant. In order to obtain highly accurate, reproducible sub-micron dimensions, a good control of the silylation process, particularly the silylation depth, is of utmost importance.

The diagram of FIG. 9 illustrated the relationship between the silylation time, i.e., the time the resist profile is subjected to the silylation solution, and the resulting silylation depth, the latter corresponding to the width of the sidewalls eventually obtained. For a AZ 4110 photoresist, a silylation solution of Xylene:HMCTS:NMP (89:10:1) at a temperature of 20° C., line 31, drawn from measured values 32, illustrates the linear dependence. The diagram shows that the resist silylation technique is a reliable and particularly simple process not requiring complex and expensive apparatus. Additionally, it is a room temperature process.

The new sidewall formation process has been described as applied in the fabrication of sub-micron metal line structures. It should however be apparent that there is a wide variety of other applications in, but not restricted to, the fabrication of semiconductor devices for use in integrated circuits or opto-electronic structures. Examples of structures that may be produced are sub-micron gates in refractory gate MESFET structures and laser structure gratings.

In summary, the new sidewall process allows for image transfer in the fabrication of structures with lateral dimensions in the sub-micron range. The process requires fewer, less critical steps, less complex apparatus, and shorter process times than hitherto known sidewall techniques. Furthermore, its controllability and reproducibility have been shown to be very good.

As noted hereinbefore, the subject invention has been taught with reference to a preferred embodiment. One having skill in the art will recognize the expanded application and substitution of silylation techniques to sidewall and related technologies as falling within the spirit and scope of the invention as hereinafter claimed.

What is claimed is:

1. A low temperature process for forming sidewalls on a substrate for use in the fabrication of structures with sub-micron lateral dimensions comprising the steps of:
   depositing on said substrate a layer of polymeric resist comprising active hydrogen;
   patterning said resist thereby forming a profile having horizontal surfaces and substantially vertical edges;
   treating the maskless resist with a reactive organometallic silylation solution comprising Xylene, HMCTS and n-Methylpyrrolidone, respectively amounting to 89, 10 and 1 volume %, at a temperature of between 15° and 25° C., thereby silylating the exposed horizontal and vertical edges in said resist to a predetermined depth; and
   anisotropic oxygen plasma etching said resist thereby removing the silylated resist at said horizontal surfaces and removing the unsilylated resist, leaving the silylated vertical edges.

2. Low temperature process for fabricating a line pattern of sub-micron dimensions on a semiconductor body, characterized in that it comprises the steps of:
   depositing a film of the material from which the line pattern is to be formed on the semiconductor body;
   depositing, on said film, a layer of polymeric resist comprising active hydrogen;
   patterning said resist thereby forming a profile having horizontal surfaces and substantially vertical edges;
   silylating the maskless resist by treating said resist with a reactive organometallic silylation solution comprising Xylene, HMCTS and n-Methylpyrrolidone, respectively amounting to 89, 10 and 1 volume %, at a temperature of between 15° and 25° C., thereby replacing the active hydrogens with silicon atoms in the horizontal surfaces and the substantially vertical edges of the resist to a predetermined depth;
   dry etching said resist thereby removing the silylated resist at said horizontal surfaces and, removing the unsilylated resist, leaving the silylated, substantially vertical edges, on said film;
   anisotropically etching said film not covered by said substantially vertical edges of silylated resist; and
   removing said silylated resist.

3. A process as claimed in claim 2, wherein the film from which the line pattern is to be formed consists of a metal.

4. A process as claimed in claim 3, wherein the film consists of tungsten silicide ($WSi_x$).

5. A process as claimed in claim 2 further comprising a step following said etching step, comprising removing selected portions of said vertical silylated resist leaving only those sidewalls corresponding to the line pattern which is to be formed in the underlying layer.

6. The process of claim 4 wherein said removing comprises selectively reactive ion etching using $O_2/10\%$ $CF_4$ RIE.

7. The process of claim 2 wherein said etching of said resist comprises anisotropic etching.

8. The process of claim 2 wherein said etching of said resist comprises anisotropic etching reactive ion etching comprising oxygen.

9. The process of claim 2 wherein said etching of said resist comprises; a first step comprising anisotropically etching said silylated resist by halogen enhanced exygen RIE; and
   a second step comprising said unsilylated resist by an $O_2$ plasma etch.

10. The process of claim 2 wherein said first etching step is by an $O_2/10\%$ $CF_4$ RIE.

11. A low temperature process for forming sidewalls on a substrate for use in the fabrication of structures having sub-micron lateral dimensions comprising the steps of:
    depositing on said substrate a layer of polymeric material comprising active hydrogen;
    patterning said polymeric material, said pattern having horizontal surfaces and substantially vertical surfaces;
    forming a sub-micron structure in said horizontal and substantially vertical surfaces of said polymeric material by silylating said material by treating said material with a solution comprising Xylene, HMCTS and n-methylpyrrolidone, respectively amounting to 89, 10 and 1 volume %, at a temperature of between 15° and 25° C., to a predetermined depth; and
    etching said polymeric material thereby removing said sub-micron structure in said horizontal surfaces and said polymeric material and whereby said submicron structure formed in said substantially vertical surfaces remains.

12. The process of claim 11 wherein said etching of said polymeric material comprises anisotropic etching.

13. The process of claim 11 wherein said etching of said polymeric material comprises anisotropic ion etching comprising oxygen.

14. The process of claim 11 wherein said etching comprises;
    a first etching step comprising anisotropically etching said silylated resist by halogen enhanced oxygen RIE; and
    a second etching step comprising etching said unsilylated resist by an oxygen plasma etch.

15. The process of claim 14 wherein said first etching step is by $O_2/10\%$ $CF_4$ RIE.

* * * * *